United States Patent
Oostrom et al.

(10) Patent No.: US 10,262,853 B2
(45) Date of Patent: Apr. 16, 2019

(54) REMOVING PARTICULATE CONTAMINANTS FROM THE BACKSIDE OF A WAFER OR RETICLE

(71) Applicant: Nederlandse Organisatie voor toegepast-natuurwetenschappelijk Onderzoek TNO, s-Gravenhage (NL)

(72) Inventors: Sjoerd Oostrom, s-Gravenhage (NL); Jacques Cor Johan Van Der Donck, s-Gravenhage (NL); Olaf Kievit, s-Gravenhage (NL); Nicole Ellen Papen-Botterhuis, s-Gravenhage (NL)

(73) Assignee: Nederlandse Organisatie voor toegepast-natuurwetenschappelijk Onderzoek TNO, 's-Gravenhage (NL)

( * ) Notice: Subject to any disclaimer, the term of this patent is extended or adjusted under 35 U.S.C. 154(b) by 0 days.

(21) Appl. No.: 15/313,027

(22) PCT Filed: May 29, 2015

(86) PCT No.: PCT/NL2015/050387
§ 371 (c)(1),
(2) Date: Nov. 21, 2016

(87) PCT Pub. No.: WO2015/183095
PCT Pub. Date: Dec. 3, 2015

(65) Prior Publication Data
US 2017/0194134 A1    Jul. 6, 2017

(30) Foreign Application Priority Data

May 30, 2014    (EP) .................................... 14170534

(51) Int. Cl.
*H01L 21/02* (2006.01)
*B08B 7/00* (2006.01)
(Continued)

(52) U.S. Cl.
CPC ........ *H01L 21/0209* (2013.01); *B08B 7/0028* (2013.01); *G03F 1/82* (2013.01);
(Continued)

(58) Field of Classification Search
CPC ..... B08B 7/0028; G03F 1/82; H01L 21/0209; H01L 21/02096; H01L 21/3221; H01L 21/67046
See application file for complete search history.

(56) References Cited

U.S. PATENT DOCUMENTS 5,762,688 A * 6/1998 Ziger .................... H01L 21/306
257/E21.215
2007/0128552 A1  6/2007 Sawada et al.

FOREIGN PATENT DOCUMENTS

KR    10-2007-0115331    12/2007

OTHER PUBLICATIONS

Machine translation of Cho et. al., KR-10-2007-0115331, published Dec. 2007, Nov. 27, 2017.*
(Continued)

*Primary Examiner* — Bilkis Jahan
*Assistant Examiner* — Victor V Barzykin
(74) *Attorney, Agent, or Firm* — Morrison & Foerster LLP

(57) ABSTRACT

The invention is directed to a method for removing particulate contaminants from the backside of a wafer or reticle, and to a cleaning substrate for use in such method. In the method of the invention particulate contaminants are removed from the backside of a wafer or reticle with a cleaning substrate. The cleaning substrate comprises protrusions and a tacky layer between the protrusions. The method comprises contacting the backside of the wafer or reticle with the protrusions of the cleaning substrate while main-
(Continued)

Figure 1:
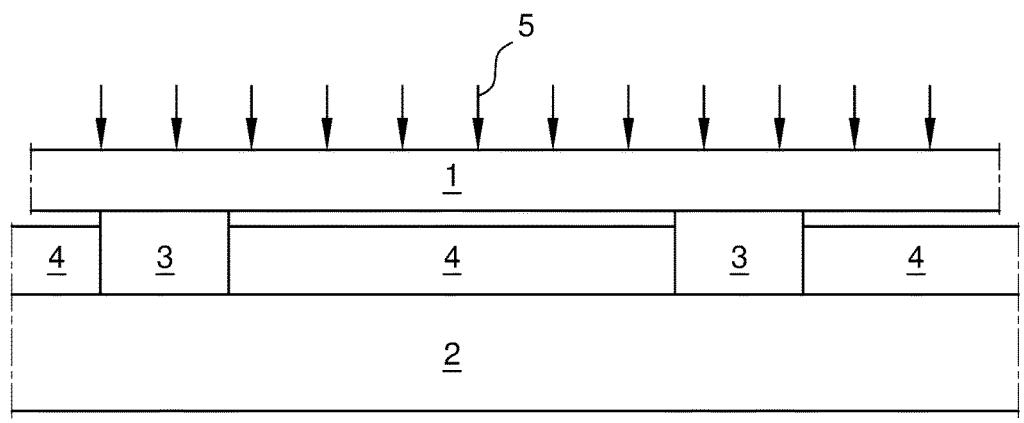

taining a distance between the wafer or reticle and the tacky layer, the distance being in the range of 1-10 μm.

23 Claims, 2 Drawing Sheets

(51) Int. Cl.
  *G03F 1/82* (2012.01)
  *H01L 21/67* (2006.01)
  *H01L 21/322* (2006.01)
  *G03F 7/16* (2006.01)
(52) U.S. Cl.
  CPC .... *H01L 21/02096* (2013.01); *H01L 21/3221* (2013.01); *H01L 21/67046* (2013.01); *G03F 7/168* (2013.01)

(56) References Cited

OTHER PUBLICATIONS

International Search Report for PCT/NL2015/050387, dated Sep. 1, 2015, 3 pages.

\* cited by examiner

REMOVING PARTICULATE CONTAMINANTS FROM THE BACKSIDE OF A WAFER OR RETICLE

CROSS-REFERENCE TO RELATED APPLICATIONS

This application is the national phase of PCT application PCT/NL2015/050387 having an international filing date of 29 May 2015, which claims benefit of European patent application No. 14170534.3 filed 30 May 2014. The contents of the above patent applications are incorporated by reference herein in their entirety.

The invention is directed to a method for removing particulate contaminants from the backside of a wafer or reticle, and to a cleaning substrate for use in such method.

During fabrication of integrated circuit chips, wafers are processed via a plurality of processing modules that create the various dielectric and metal layers that comprise the semiconductor devices. In the fabrication process the chips are built up layer by layer on the substrate, which typically is a semiconductor wafer. In general, the various distinct layers are typically applied on the substrate by lithography and tested by metrology, while the wafer is held by a so-called wafer chuck.

The fabrication of such integrated circuit chips requires super clean manufacturing environments and equipment. As the integrated chips are manufactured, they too must be maintained in a super clean condition. Any contamination can, and often does, damage or even ruin the resulting chips. Consequently, the chip manufacturing industry has long been engaged in seeking more effective, more efficient, and less costly techniques for maintaining a super clean environment during manufacturing of integrated circuit chips.

In this regards, chips are commonly manufactured on so-called wafer chucks in the chip manufacturing apparatus. Differing wafer chucks are used to form differing portions of electronic circuitry components on the wafer. A wafer chuck can often have a complex surface structure, including burls, flat areas, sealing rings, vacuum ports, and other structures.

During wafer manufacturing, small particulate contamination may build up between the wafer chuck and the wafer. These particulate contaminants may be present on the wafer chuck or on the backside of the wafer, or both.

Contamination on the backside of the wafer can be created during many different semiconductor integrated circuit manufacturing steps. In many cases, coming into contact with the wafer handling/processing equipment contaminates the wafer backside. For example, robotic components such as end effectors, wafer chucks, and wafer cassettes and other wafer storage devices cause different kinds of particles to be attached to the backside of a wafer. This may occur during a variety of wafer exchange procedures and is associated with the friction, high vacuum contact forces and electrostatic charge build-up and discharge cycles that occur during such transfers.

Other types of contamination on a wafer backside may result from various chemical processes to which the wafer is subjected during processing. Although these processes are primarily intended to affect the top surface of the wafer, inevitably some effect on the wafer backside may result as well. For example, residues of photo resist polymer may adhere to the wafer backside during lithographic procedures (e.g., coating, baking and stripping). Metal contamination of the backside may also occur during various types of dry or wet processes.

Wafer backside contamination leads to overall yield degradation as the backside contamination may ultimately reach the top surface of the wafer, harming sensitive devices. In addition, backside contamination that affects the planarity of a wafer may cause problems with photolithographic procedures. For example, large particles adhering to the backside may act like bumps and when ultra flat chucks are used to support the wafer during photolithographic procedures, these bumps may cause the top side of the wafer to be positioned out of focus for the lithographic procedure (wafers stage cannot compensate the increased local angle), again resulting in lower overall component yield.

Reticle backside contamination also leads to overall yield degradation as the backside contamination affects the planarity of the reticle which also introduces problems with photolithographic procedures. Large particles adhering to the backside may act like bumps, these bumps may deform the mask image (increase in local angle) which cannot be compensated for during the lithographic procedure (again resulting in lower overall component yield).

In view of these disadvantages, removing such contaminants has therefore long presented a substantial challenge.

Some particulate contaminant removal methods have been proposed in the art. Typically, these can be dived in off-line wet cleaning of wafers and cleaning of the wafer chuck using so-called cleaning wafers.

Wet cleaning methods are, for instance, known from US-A-2003/0 100 996 and US-A-2011/0 114 120. Off-line wet cleaning can, however, not be applied after all integrated circuit process steps, because the solvent may have detrimental effects. Additionally, wet cleaning of the wafer is neither applicable in situ, nor in vacuum.

Wafer chuck cleaning, on the other hand, is performed when the wafer chuck is contaminated with particles, i.e. when the damage has already been done. In order to clean the wafer chuck, unscheduled down time is required. The wafer chuck may, for example, be cleaned with so-called cleaning wafers, which have a tacky layer at the backside which is pressed to the wafer chuck. Particulate contaminants stick to the tacky layer on the cleaning wafer and are thus removed from the contaminated wafer chuck. Methods for cleaning contaminated wafer chucks with cleaning wafers are, for instance, known from US-A-2007/0 163 621 and US-A-2010/0 083 980. Also U.S. Pat. No. 5,762,688 discloses a cleaning wafer which can be used in order to remove any particles from the equipment. The cleaning wafer, however, can also leave behind an undesirable residue on the wafer chuck, because the wafer chuck is in direct contact with the cleaning wafer.

Further attempts have been made in designing in situ backside wafer cleaning (wafer on a wafer chuck). Such attempts include cleaning of a wafer chuck with ultrasound vibration (JP-A-2000 195 930), cleaning with a laser or megasonic (U.S. Pat. No. 7,045,019), and cleaning of a wafer chuck with a cleaning cloth (US-A-2012-A-0 180 813).

KR-A-2007/0 115 331 discloses an apparatus with which particles can be removed from the rear side of a wafer by using a fixed chuck provided with an adhesive mat. The entire backside wafer surface is brought into contact with the adhesive mat.

There remains a need for further improved methods for removing particulate contaminants from the backside of a wafer and reticle, in particular methods that do not suffer from the drawbacks of the methods already known. The invention is aimed at fulfilling this need in the art.

The inventors found that particulate contaminants on the backside of a wafer or reticle can advantageously be removed by using a specific cleaning substrate.

Accordingly, in a first aspect the invention is directed to a method for removing particulate contaminants from the backside of a wafer or reticle with a cleaning substrate, said cleaning substrate comprising protrusions and a tacky layer between said protrusions, and wherein said method comprises contacting the backside of said wafer or reticle with the protrusions of said cleaning substrate while maintaining a distance between the wafer and said tacky layer, the distance being in the range of 1-10 μm.

In accordance with the method of the invention, the backside of a wafer or reticle is cleaned in a preventive manner. Hence, particulate contaminants are removed before they can harm the process or cause damage to the wafer chuck. Advantageously, this prevents unscheduled down time of the manufacturing process for the integrated circuit chips. By removing the particulates prior to substrate chucking the method prevents particle disintegration (causing a significant amount of small particles) and/or the build up of significant adhesion forces (particle deforms towards the chuck). Both effects causing additional issues (more particles which could transfer onto the front side or very hard to remove once deformed).

The method of the invention is a dry method, it is quick and almost contactless. A tacky layer is applied between protrusions of a cleaning substrate. The backside of the wafer or reticle is then contacted with the protrusions of the cleaning substrate while a small distance is kept between the wafer and the tacky layer. Accordingly, the wafer or reticle is not in physical contact with the tacky layer. This distance is very precise and controllable. Only particulate contaminants on the backside wafer or reticle surface that are large enough will contact the tacky layer and be absorbed by the tacky material, and as such removed from the wafer or reticle.

In the context of the present application a "tacky layer" is considered a layer that has been engineered to adhere particulate contaminants. The degree of adhesion depends on many factors (particulate and tacky material), including the amount of surface area interaction, Young's modulus, surface energies, contact time and pressure between the surfaces, the ambient temperature, inter-diffusion, and chemical reactions. Generally higher adhesive forces between the tacky layer and a particle will remove a larger fraction of the particle population on the backside of the wafer or reticle.

The tacky layer preferably comprises one or more materials selected from acrylic or methacrylic adhesive, and polyurethane. Preferably, said tacky layer is a three dimensionally cross-linked, soft polymeric material. It can be made of e.g. acrylic and/or methacrylic monomers or mixtures thereof, mixtures of acrylic and/or methacrylic polymers, or based on polyurethane polymers. Suitably, the polymer is easily deformable by mechanical contact with particulates, such that the particulates are (partially) embedded in the layer during the cleaning process, thereby increasing the contact surface between particulate and tacky layer. Indent depths at a fixed force and layer recovery after removal of this force can be measured by micro indentation.

Other examples of materials for tacky layers are pressure sensitive adhesives, such as for instance described in U.S. Pat. No. 5,902,678 and U.S. Pat. No. 5,187,007, of which the contents are herewith completely incorporated by reference. The tacky films sold by Gel-Pak® Corporation predictably adhere and cleanly release from test surfaces.

The tacky layer may further comprise additives. For example, the tacky layer can comprise one or more additives to improve ionic and electronic conduction of the tacky material so that it can dissipate static electricity. Some examples of such additives include carbon fibres, graphite and aluminium powders.

The tacky layer may have a thickness of 5-25 μm, such as 10-20 μm. Thicker layers will have the advantage that also relatively large particulates can still fully desorb into the tacky layer (and generate higher adhesion forces towards the tacky layer). Thinner layers have the advantage that the tacky layer thickness is easier to control, but also has several other advantages not specifically related towards the layer itself (but with the manufacturability of the cleaning chuck). For example, the height of the protrusions can be controlled with higher resolution and in the case of integrating the layer onto a Coulomb based electrostatic chuck increases the clamping force which can be achieved (or reduces the voltages required to reach a certain clamping pressure).

The tacky layer may be applied on the cleaning substrate by means of capillary fill, spin coating and printing techniques like screen printing or inkjet printing of the uncured polymer, eventually combined with lithographic techniques such as selective curing and/or etching to achieve the desired layer geometry. Printing techniques have the advantage that they allow for patterned layer deposition which makes sure that the protrusions themselves are kept free from material. Capillary fill has the advantage that the polymer layer thickness is controlled by the top plane of the protrusions rather than the base plate of the cleaning substrate (which decreases protrusion tolerance requirements).

Once applied the material is cross-linked to form the actual tacky layer. By polymerising the material locally (in between the protrusions) the protrusions themselves can be kept free from polymer (uncured polymer can be cleaned from the protrusions). Alternatively, a (selective) etching step can be used to etch remnant layers of cured polymer from the top surface of the protrusions. Similarly, such an etching process can also be applied to the tacky layer in between the protrusions whereby the tacky layer can be etched to its final/desired layer thickness (achieving the desired gap between the tacky layer and the plane of the protrusions).

The protrusions of said cleaning substrate may protrude from the substrate base surface from for 5 μm or more, such as 10 μm or more, or 15 μm or more. Typically, the protrusions will protrude 35 μm or less from the substrate base surface, such as 30 μm or less. Accordingly the protrusions may protrude 5-35 μm from the substrate base surface, such as 10-35 μm, or 15-30 μm.

The cleaning substrate may be provided with the protrusions by chemical vapour deposition (CVD), plasma-enhanced chemical vapour deposition (PECVD), grid blasting, or erosion/etching (using masks to achieve the intended protrusion layout).

In accordance with the method of the invention, the wafer or reticle is contacted with the protrusions of the cleaning substrate. This may be performed such that the cleaning substrate holds the wafer or reticle, or in other words that the wafer or reticle is pulled towards the cleaning substrate. This holding or pulling may be realised in various manners, including by electrostatic forces, by applying a vacuum, by using overpressure, and the like.

The wafer can suitably be a semiconductor wafer, such as a silicon wafer. Reticles are sometimes referred to as masks.

They are used for applying a pattern on the integrated circuit. The reticle can be an extreme ultraviolet (EUV) reticle.

The cleaning substrate can comprise ceramic and/or glass. Examples of ceramics include $Al_2O_3$, AlN, and SiSiC. Suitable commercial examples of glass include AF 32® (available from Schott) and ULE® (available from Corning). In an embodiment, the cleaning substrate is a ceramic cleaning substrate. In another embodiment, the cleaning substrate is a glass cleaning substrate.

In a special embodiment, the cleaning substrate is a wafer chuck. Hence, in this embodiment, the cleaning substrate and its features are integrated in a wafer chuck that is used in-line in the integrated circuit manufacturing process. In such an embodiment, the backside of the wafer or reticle will be cleaned in situ.

The method of the invention may further comprise regenerating the cleaning substrate by stripping the tacky layer and applying a new tacky layer on said cleaning substrate. For instance, if the cleaning substrate has been used for cleaning the backside of a wafer and/or reticle multiple times, the tacky layer may become saturated with particulate contaminants that are removed from the wafers and/or reticles. It is then desirable to regenerate the cleaning surface by stripping the tacky layer off the cleaning substrate and applying a fresh tacky layer. After application of the fresh tacky layer, the cleaning substrate can again be used for cleaning.

The method of the invention is preferably performed in the absence of solvent.

In an embodiment, the method of the invention is carried out in vacuum. When the method of the invention is carried out in vacuum, it is preferred that the material of the tacky layer has an outgassing in vacuum of less than $1.3 \times 10^{-4}$ mbar·l·s$^{-1}$. Therefore the polymer is preferably well cross-linked, avoiding unreacted groups in the material.

Preferably, 2% or less of the wafer or reticle backside surface area is contacted with the protrusions of the cleaning substrate, more preferably 1% or less. This means that 98% or more, preferably 99% or more, of the wafer or reticle backside surface area can be cleaned, while the remaining surface area is in direct contact with the protrusions of the cleaning substrate. This will normally allow a single step cleaning of the backside surface of the wafer or reticle, which is highly advantageous in terms of efficiency of the manufacturing process. If required, the cleanable area can be increased to 100% with a secondary cleaning step which is performed using a specific wafer or reticle offset. Hereby, the wafer or reticle offset should be larger than the diameter of the protrusion such that the contact surface (at the first cleaning step) is now in a position which can be cleaned by the cleaning chuck. Preferably, the offset is set at half the protrusion pitch. Accordingly, in an embodiment the method of the invention comprises first contacting the backside of said wafer or reticle with the protrusions of a first cleaning substrate while maintaining a distance of 1-10 µm between the wafer or reticle and a first tacky layer on the first cleaning substrate, and thereafter contacting the backside of said wafer or reticle with the protrusions of a second cleaning substrate while maintaining a distance of 1-10 µm between the wafer or reticle and a second tacky layer on the second cleaning substrate, wherein the protrusions of the first cleaning substrate are offset with respect to the protrusions of the second cleaning substrate. Preferably, the protrusions of the first cleaning substrate are offset with respect to the protrusions of the second cleaning substrate in a manner to allow a cleanable area of 100%.

In an alternative method, the backside of the wafer or reticle is first contacted with the protrusions of the cleaning substrate while maintaining a distance in the range of 1-10 µm between the wafer or reticle and the tacky layer on the cleaning substrate. Then, the wafer or reticle is de-chucked (i.e. the cleaning substrate and the wafer or reticle are separated) and an offset with respect to the original contact is created, such as by movement of the wafer or reticle, by movement of the cleaning substrate or both. The offset is preferably such that the original contact position of the protrusions on the wafer or reticle is no longer contacted, which advantageously allows a cleanable area of 100%. Advantageously, this alternative allows a cleanable area of 100% with only a single cleaning substrate.

Hence, in an embodiment the invention provides for a method for removing particulate contaminants from the backside of a wafer or reticle with a cleaning substrate, wherein said method comprises
    contacting the backside of the wafer or reticle with the protrusions of the cleaning substrate a first time while maintaining a distance in the range of 1-10 µm between the wafer or reticle and the tacky layer on the cleaning substrate,
    giving the wafer or reticle an offset with respect to the protrusions of the cleaning substrate, and
    contacting the backside of the wafer or reticle with the protrusions of the cleaning substrate a second time while maintaining a distance in the range of 1-10 µm between the wafer or reticle and the tacky layer on the cleaning substrate.

In a further aspect, the invention is directed to a cleaning substrate for cleaning the backside of a wafer or reticle, said cleaning substrate comprising protrusions and a tacky layer between said protrusions, wherein a distance is defined between the protrusions and the tacky layer, said distance being in the range of 1-10 µm, such as in the range of 2-9 µm, or in the range of 3-8 µm. The cleaning substrate can suitably be used in a method for removing particular contaminants from the backside of a water or reticle as described herein.

This cleaning substrate may suitably be used in the method of the invention for cleaning the backside of a wafer or reticle.

Preferably, the protrusions protrude 5-35 µm from the cleaning substrate base surface, such as 10-30 µm. The thickness of the tacky layer between the protrusions can be the range of 5-25 µm, such as 10-20 µm.

The invention is further elucidated by means of the schematic figures illustrating non-limiting embodiments of the method of the invention.

FIG. 1 is a cross-section view that illustrates cleaning chuck baseplate 2 with protrusions 3. Tacky layer 4 is applied on cleaning chuck baseplate 2 between different protrusions 3. In particular, this figure shows how the substrate is flattened using external force 5.

Figure 2:
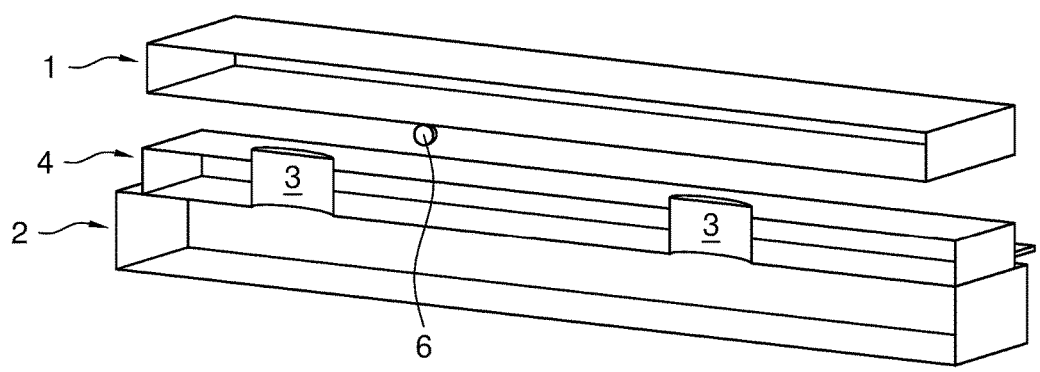

FIG. 2 is a cross-section view that illustrates how the backside of wafer 1 is contaminated with particle 6. The contaminated wafer 1 is approaching the cleaning chuck with protrusions.

Figure 3:
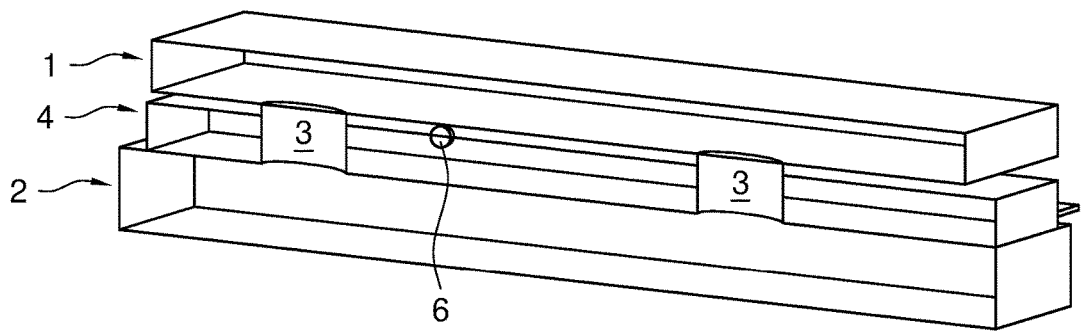

FIG. 3 is a cross-section view that illustrates how the substrate is flattened (achieving the required gap between tacky layer 4 and the backside 1 of the substrate to be cleaned), and whereby particle 6 is pressed into tacky layer 4.

Figure 4:
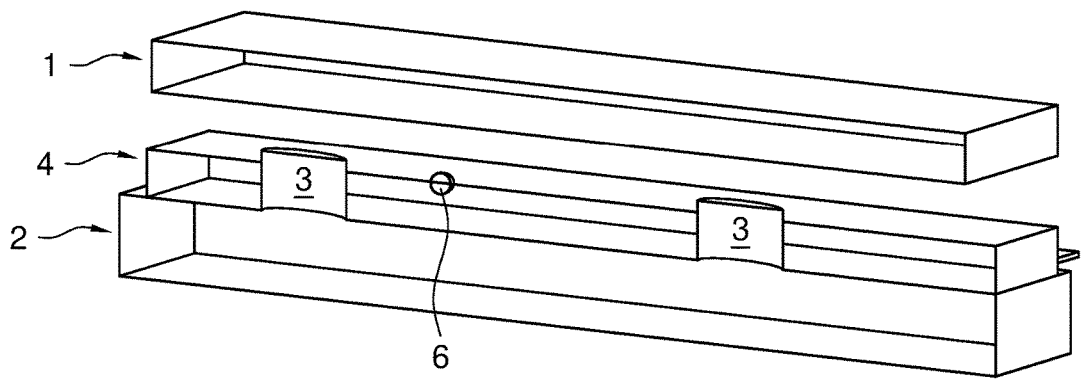

FIG. 4 is a cross-section view that illustrates how the substrate to be cleaned 1 is removed from the cleaning chuck, whereby particle 6 remains adsorbed within tacky layer 4 and is thus removed from the backside of the substrate to be cleaned 1.

For the purpose of clarity and a concise description features are described herein as part of the same or separate embodiments, however, it will be appreciated that the scope of the invention may include embodiments having combinations of all or some of the features described.

The invention claimed is:

1. A method for removing particulate contaminants from the backside of a wafer or reticle with a cleaning substrate, said cleaning substrate comprising protrusions and a tacky layer between said protrusions, and wherein said method comprises contacting the backside of said wafer or reticle with the protrusions of said cleaning substrate while maintaining a distance between the wafer or reticle and said tacky layer, the distance being in the range of 1-10 µm, and controlled so that only contaminants that are sufficiently large to occupy the space between the wafer or reticle and the tacky layer will be absorbed by the tacky layer and removed from the wafer or reticle.

2. The method of claim 1, wherein said tacky layer comprises one or more materials selected from acrylic or methacrylic adhesive, and polyurethane.

3. The method of claim 1, wherein the tacky layer has a thickness of 5-25 µm.

4. The method of claim 3, wherein the tacky layer has a thickness of 10-20 µm.

5. The method of claim 1, wherein said protrusions protrude 5-35 µm from the cleaning substrate base surface.

6. The method of claim 5, wherein said protrusions protrude 10-30 µm from the cleaning substrate base surface.

7. The method of claim 1, wherein said contacting comprises holding the wafer or reticle to the cleaning substrate by one or more forces selected from the group consisting of electrostatic, vacuum, overpressure, and capillary force.

8. The method of claim 1, wherein said wafer is a silicon wafer.

9. The method of claim 1, wherein said cleaning substrate comprises ceramic and/or glass.

10. The method of claim 1, wherein said cleaning substrate is a wafer chuck and said method is performed in situ in a wafer processing method.

11. The method of claim 1, further comprising regenerating said cleaning substrate by stripping the tacky layer and applying a new tacky layer on said cleaning substrate.

12. The method of claim 1, wherein said method is performed in the absence of solvent.

13. The method of claim 1, wherein said method is performed in vacuum.

14. The method of claim 1, wherein 2% or less of the wafer or reticle backside surface area is contacted with the protrusions of the cleaning substrate.

15. The method of claim 14, wherein 1% or less of the wafer or reticle backside surface area is contacted with the protrusions of the cleaning substrate.

16. The method of claim 1, wherein said method comprises (a) first contacting the backside of the wafer or reticle with the protrusions of a first cleaning substrate while maintaining a distance in the range of 1-10 µm and controlled so that only contaminants that are sufficiently large to occupy the space between the wafer or reticle and the tacky layer will be absorbed by the tacky layer and removed from the wafer or reticle between the wafer or reticle and a first tacky layer on the first cleaning substrate, and (b) thereafter contacting the backside of the wafer or reticle with the protrusions of a second cleaning substrate while maintaining a distance of 1-10 µm and controlled so that only contaminants that are sufficiently large to occupy the space between the wafer or reticle and the tacky layer will be absorbed by the tacky layer and removed from the wafer or reticle between the wafer or reticle and a second tacky layer on the second cleaning substrate, wherein the protrusions of the first cleaning substrate are offset with respect to the protrusions of the second cleaning substrate.

17. The method of claim 16, wherein the protrusions of the first cleaning substrate are offset with respect to the protrusions of the second cleaning substrate in a manner to allow a cleanable area of 100%.

18. The method of claim 1, wherein said method comprises (a)—contacting the backside of the wafer or reticle with the protrusions of the cleaning substrate a first time while maintaining a distance in the range of 1-10 µm and controlled so that only contaminants that are sufficiently large to occupy the space between the wafer or reticle and the tacky layer will be absorbed by the tacky layer and removed from the wafer or reticle between the wafer or reticle and the tacky layer on the cleaning substrate, (b)—giving the wafer or reticle an offset with respect to the protrusions of the cleaning substrate, and (c)—contacting the backside of the wafer or reticle with the protrusions of the cleaning substrate a second time while maintaining a distance in the range of 1-10 µm and controlled so that only contaminants that are sufficiently large to occupy the space between the wafer or reticle and the tacky layer will be absorbed by the tacky layer and removed from the wafer or reticle between the wafer or reticle and the tacky layer on the cleaning substrate.

19. A cleaning substrate for cleaning the backside of a wafer or reticle, said cleaning substrate comprising protrusions and a tacky layer between said protrusions, wherein a distance is defined between the protrusions and the tacky layer, said distance being in the range of 1-10 µm, and controlled so that only contaminants that are sufficiently large to occupy the space between the wafer or reticle and the tacky layer will be absorbed by the tacky layer and removed from the wafer or reticle, wherein the tacky layer comprises three-dimensionally cross-linked soft polymeric material.

20. The cleaning substrate of claim 19, wherein the protrusions protrude 5-35 µm from the cleaning substrate base surface.

21. The cleaning substrate of claim 20, wherein the protrusions protrude 10-30 µm from the cleaning substrate base surface.

22. The cleaning substrate of claim 19, wherein said tacky layer has a thickness of 5-25 µm.

23. The cleaning substrate of claim 22, wherein said tacky layer has a thickness of 10-20 µm.

* * * * *